(12) United States Patent
Han et al.

(10) Patent No.: US 7,833,811 B2
(45) Date of Patent: Nov. 16, 2010

(54) SIDE-EMITTING LED PACKAGE AND METHOD OF MANUFACTURING THE SAME

(75) Inventors: Kyung Taeg Han, Kyungki-do (KR); Myoung Soo Choi, Seoul (KR); Seon Goo Lee, Kyungki-do (KR); Hun Joo Hahm, Kyungki-do (KR); Seong Yeon Han, Kyungki-do (KR); Chang Ho Song, Seoul (KR); Young Sam Park, Seoul (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 0 days.

(21) Appl. No.: 12/155,961

(22) Filed: Jun. 12, 2008

(65) Prior Publication Data

US 2008/0254558 A1  Oct. 16, 2008

Related U.S. Application Data

(62) Division of application No. 11/444,402, filed on Jun. 1, 2006, now abandoned.

(30) Foreign Application Priority Data

Jun. 1, 2005  (KR) .................. 10-2005-0046618

(51) Int. Cl.
*H01L 27/15* (2006.01)
*H01L 29/24* (2006.01)

(52) U.S. Cl. .............. 438/27; 438/22; 438/25; 438/26; 438/29; 257/79; 257/103

(58) Field of Classification Search .......... 257/79–103; 438/22, 25–27, 29

See application file for complete search history.

(56) References Cited

U.S. PATENT DOCUMENTS 6,674,096 B2  1/2004 Sommers (Continued)

FOREIGN PATENT DOCUMENTS

JP  10-082916  3/1998

(Continued)

OTHER PUBLICATIONS

Japanese Office Action issued in Japanese Patent Application No. JP 2006-152714, dated Sep. 29, 2009.

*Primary Examiner*—Kenneth A Parker
*Assistant Examiner*—Joseph Nguyen
(74) *Attorney, Agent, or Firm*—McDermott Will & Emery LLP (57) ABSTRACT

The invention relates to a side-emitting LED package and a manufacturing method thereof. The side-emitting LED package includes a substrate with an electrode formed thereon, and a light source disposed on the substrate and electrically connected to the electrode. The side-emitting LED package also includes a molded part having an upper surface with a center thereof depressed concavely, covering and protecting the substrate and the light source, and a reflection layer covering an entire upper surface of the molded part to reflect light sideward from the molded part which forms a light transmitting surface. The package is not restricted in the shape of the molded part and is not affected by the LED chip size, enabling a compact structure. The invention can also process a substrate by a PCB process, enabling mass-production.

4 Claims, 7 Drawing Sheets

U.S. PATENT DOCUMENTS

| | | |
|---|---|---|
| 2002/0163810 A1 | 11/2002 | West et al. |
| 2003/0001140 A1* | 1/2003 | Starkey ................. 252/301.35 |
| 2003/0173575 A1 | 9/2003 | Eisert et al. |
| 2004/0169187 A1* | 9/2004 | Fujii ........................... 257/98 |
| 2004/0223315 A1 | 11/2004 | Suehiro et al. |
| 2005/0176168 A1* | 8/2005 | Yee ............................. 438/68 |
| 2005/0184951 A1* | 8/2005 | Kim et al. ................... 345/102 |
| 2006/0119250 A1 | 6/2006 | Suehiro et al. |

FOREIGN PATENT DOCUMENTS

| | | |
|---|---|---|
| JP | 2001-257381 | 9/2001 |
| JP | 2003-008081 | 1/2003 |
| JP | 2003-158302 | 5/2003 |
| JP | 2003-218408 | 7/2003 |
| JP | 2004-140327 A | 5/2004 |

* cited by examiner

SIDE-EMITTING LED PACKAGE AND METHOD OF MANUFACTURING THE SAME

CLAIM OF PRIORITY

This application is a Divisional of U.S. application Ser. No. 11/444,402, filed Jun. 1, 2006, now abandoned and claims the benefit of Korean Patent Application No. 10-2005-46618 filed on Jun. 1, 2005, in the Korean Intellectual Property Office, the disclosures of each of which are incorporated herein by reference.

BACKGROUND OF THE INVENTION

1. Field of the Invention

The present invention relates to a side-emitting LED package for emitting light sideward, and a method of manufacturing the same. More particularly, the invention relates to a side-emitting LED package, which has a reflective layer easily manufactured into desired shapes for emitting light sideward, can be mass-produced in a compact size regardless of an LED chip size, and can have an LED array inside thereof, thereby significantly improving productivity, and a method of manufacturing the same.

2. Description of the Related Art

Recently, an LED package has been increasingly adopted in an LCD backlight unit (LCD BLU). The high power package used for an LCD backlight unit adopts vertical side emission method in which a package with a heat slug mounted thereon is covered by a lens, which results in a problem of a quite large thickness. However, the current trend is that slimmer LCD backlight units require slimmer LED packages therefor.

Figure 1A:
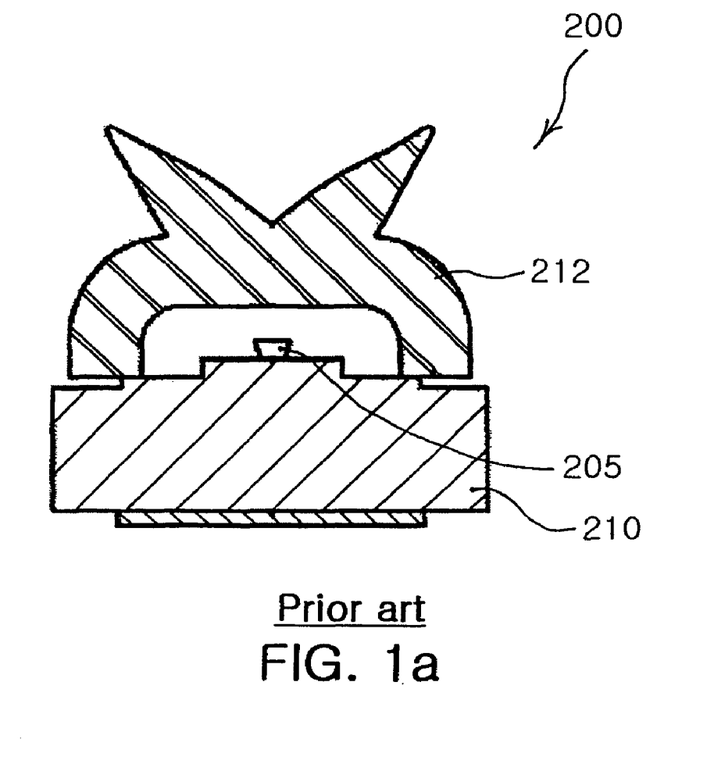

FIG. 1(a) illustrates a side emitting LED package 200 according to the prior art. In such a conventional structure, a substrate 210 with an LED chip 205 mounted thereon is covered by a lens 212. This entails an additional process of bonding the lens 212 onto the substrate 210 in which a separate lens 212 is manufactured and bonded.

Figure 1B:
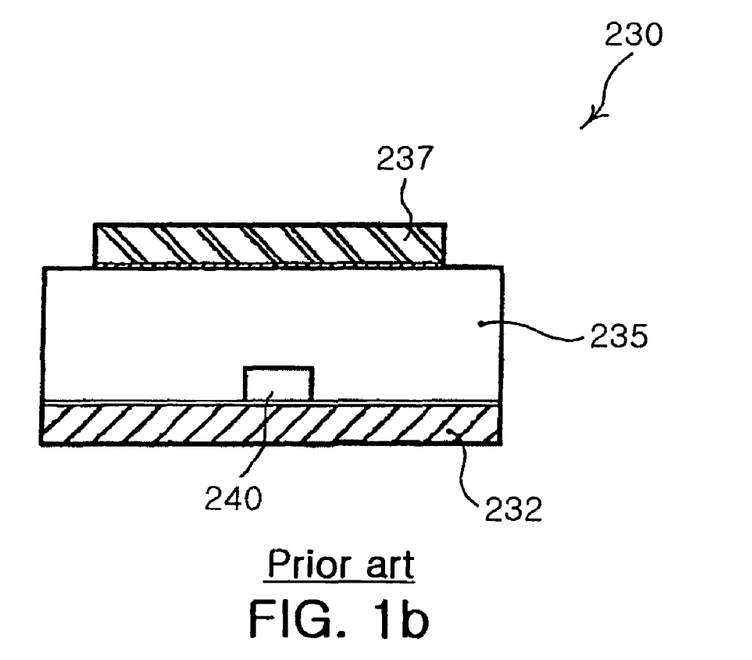

FIG. 1(b) illustrates another conventional LED structure 230. In this conventional technology, a planar reflective film 237 is formed on a molded part 235 on a substrate 232. However, this method is not effective in allowing light from the LED chip 240 to be reflected on the reflective film and reflected sideward from the package.

Figure 2A:
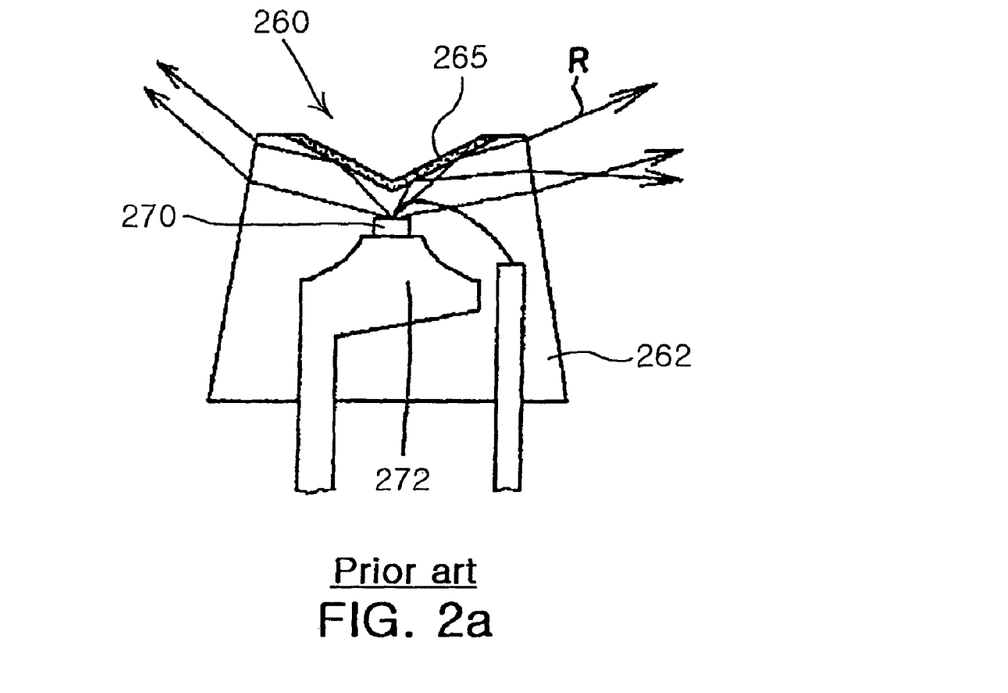

FIG. 2(a) illustrates further another structure of an LED package 260. This conventional structure is taught in Japanese Patent Publication 10-82916, in which a molded part 262 has a concave depression on an upper surface thereof, and a reflection layer 265 formed on the concave depression to form a light transmitting surface around the sides of the molded part 262. However, in such a conventional structure, the light reflection layer 265 is formed only on some portion of the center of the molded part 262, and an LED chip 270 is mounted on a trapezoid-shaped lead terminal 272.

Therefore, such a conventional structure is limited in emitting light sideward from a conventional upward direction, and the lead terminal results in low productivity per hour.

Figure 2B:
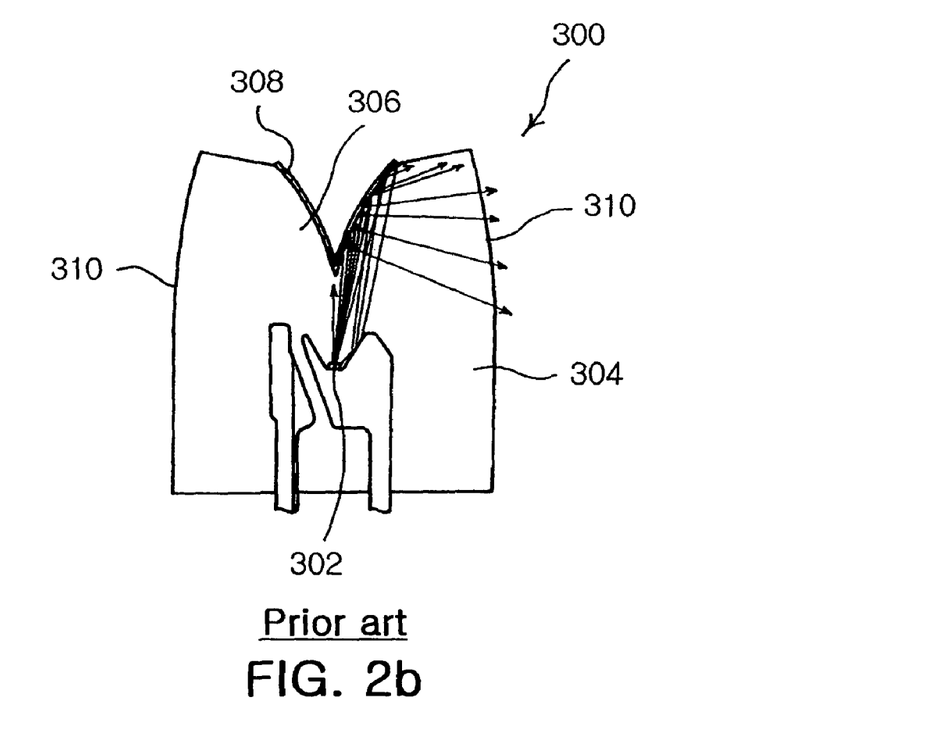

FIG. 2(b) illustrates yet another LED package 300, which is taught in U.S. Pat. No. 6,674,096 granted to Mathew L. Sommers. In this structure, a transparent molded part 304 wraps around an LED chip 302 and has a reflective surface 306 with a concavely depressed center on an upper surface thereof. And the molded part 304 has a reflective layer 308 formed on the reflecting surface 306, forming a light transmitting surface 310 around the sides of the molded part 304.

In this conventional structure, however, light is scattered upward, and thus is limited in effectively inducing light to be emitted sideward, and also has low productivity per hour owing to the lead terminal.

SUMMARY OF THE INVENTION

The present invention has been made to solve the foregoing problems of the prior art and it is therefore an object of the present invention to provide a side-emitting LED package which prevents light from being scattered upward beyond a reflective layer and effectively reflects light sideward, and a method of manufacturing the same.

It is another object of the invention to provide a side-emitting LED package having a molded part easily manufactured in a desired shape, which can be mass-produced by a manufacturing process of a PCB, and a method of manufacturing thereof.

It is yet another object of the invention to provide a method of manufacturing a side-emitting LED package adopting EMC (Epoxy Molding Compound) transfer molding to minimize color dispersion.

According to an aspect of the invention for realizing the object, there is provided a light emitting diode (LED) package for emitting light sideward from a light source including: a substrate with an electrode formed thereon; a light source disposed on the substrate and electrically connected to the electrode; a molded part having an upper surface with a center thereof depressed concavely, the molded part covering and protecting the substrate and the light source; and a reflection layer covering an entire upper surface of the molded part to reflect light sideward from the molded part which forms a light transmitting surface.

According to another aspect of the invention for realizing the object, there is provided a method of manufacturing a light emitting diode (LED) package for emitting light sideward from a light source, the method including steps of: providing a substrate with an electrode formed thereon; disposing a light source on the substrate; forming a molded part on the substrate with the light source disposed thereon, the molded part having an upper surface with a center thereof depressed concavely; forming a reflection layer for covering an entire upper surface of the molded part; and cutting the substrate, the molded part, and the reflection layer stacked in their order so that a light transmitting surface is formed on a cut section in the side of the molded part with the reflection layer thereon.

BRIEF DESCRIPTION OF THE DRAWINGS

The above and other objects, features and other advantages of the present invention will be more clearly understood from the following detailed description taken in conjunction with the accompanying drawings, in which:

FIG. 1 illustrates a side-emitting LED package according to the prior art, in which (a) is a structural view including a lens, and (b) is a block diagram including a planar reflective film;

FIG. 2 illustrates another side-emitting LED package according to the prior art, in which (a) is a sectional view illustrating the package with a concave reflecting surface and a reflective layer on an upper surface thereof, and (b) is a sectional view illustrating the package with a funnel-shaped reflecting surface and a reflective layer on a central portion of the reflecting surface;

FIG. 3 is a perspective view illustrating a side-emitting LED package according to the present invention, in which (a) is a structure with a circumferential light-transmitting surface and a funnel-shaped reflective layer, (b) is a structure with an angled light-transmitting surface and a funnel-shaped reflective layer, and (c) is a structure with an angled light-transmitting surface and a centrally depressed reflective layer with centrally depressed edges;

FIG. 4 is a sectional view illustrating the side-emitting LED package according to the present invention, in which (a) is a structure with a circumferential light-transmitting surface and a funnel-shaped reflective layer, (b) is a structure with an angled light-transmitting surface and a funnel-shaped reflective layer, and (c) is a structure with an angled light-transmitting surface and a centrally depressed reflective layer with centrally depressed edges;

FIG. 5 is a side view illustrating a side-emitting LED package according to the present invention, in which (a) is a structure having one LED chip as a light source, and (b) is a structure having a plurality of LEDs as a light source;

DETAILED DESCRIPTION OF THE PREFERRED EMBODIMENT

Preferred embodiments of the present invention will now be described in detail with reference to the accompanying drawings.

Figure 3A:
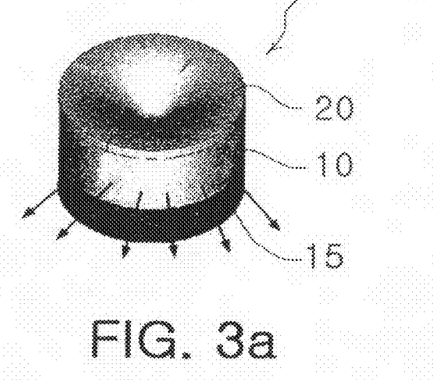
Figure 3B:
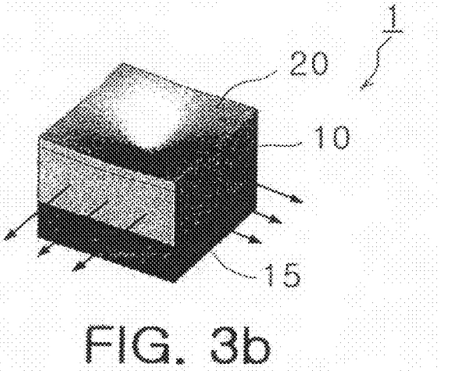
Figure 3C:
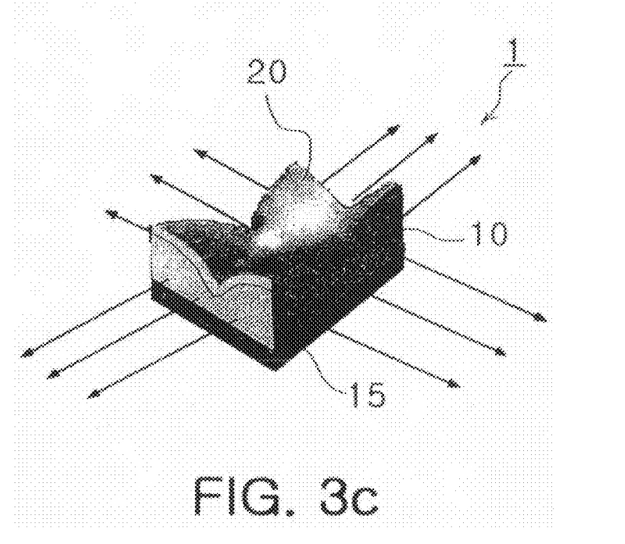
Figure 4A:
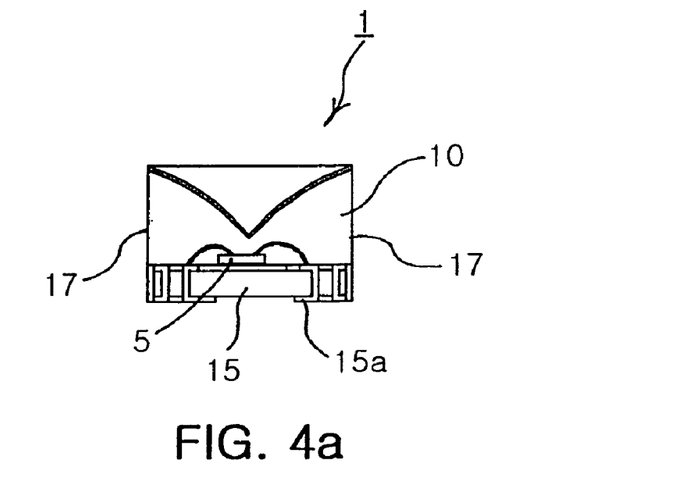
Figure 4B:
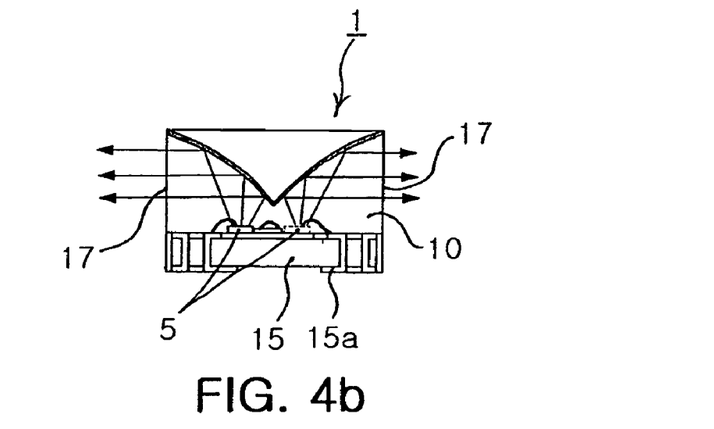
Figure 4C:
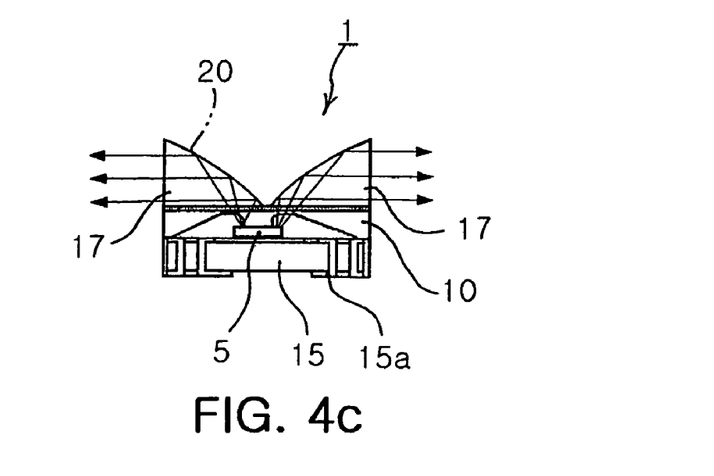
Figure 5A:
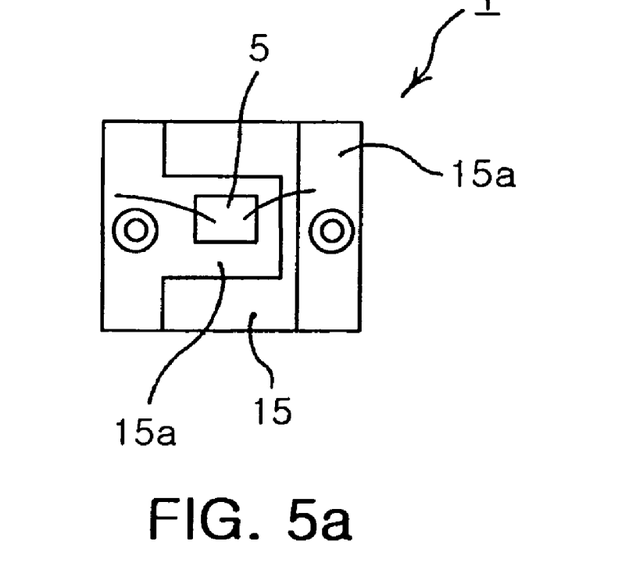
Figure 5B:
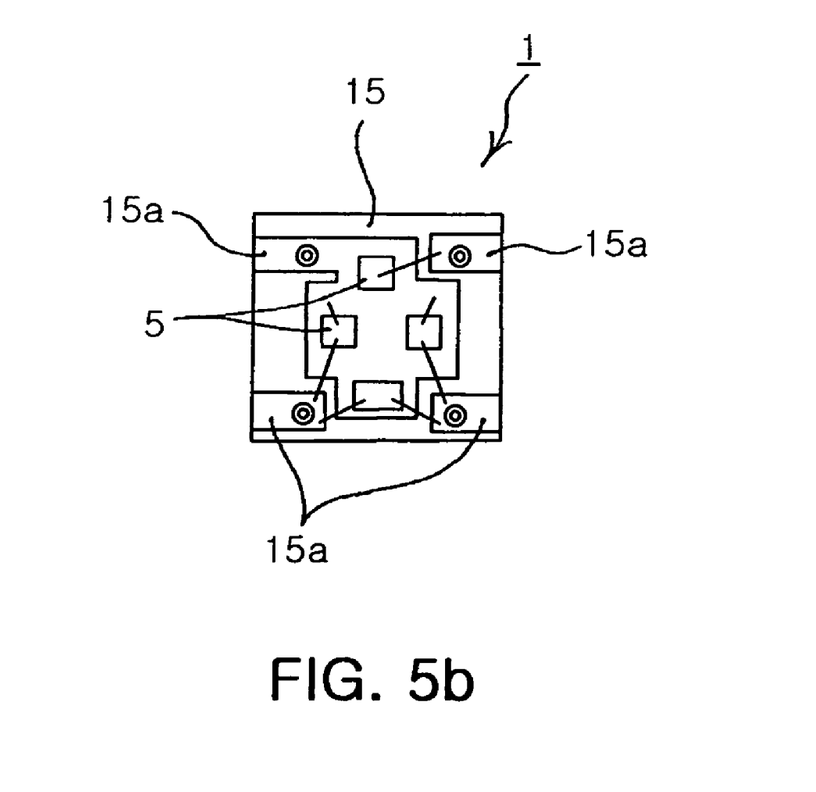

As shown in FIGS. 3 to 5, a side-emitting LED package 1 according to the present invention is for emitting light sideward from an LED chip as a light source 5 from the side of a molded part 10. The direction of light emission is preferably in parallel with a plane where the LED chip is mounted on.

The side-emitting LED package 1 according to the present invention has a substrate 15 with an electrode 15a formed thereon. The substrate 15 can preferably be a Printed Circuit Board (PCB) or a ceramic substrate with a pattern electrode or a vertical electrode 15a such as a via.

The LED chip 5 (see FIG. 4) is mounted on the substrate 15 and electrically connected to the electrode 15a. The LED chip can be a horizontal type with electric terminals formed on an upper surface thereof and can also be a vertical type with electric terminals formed on upper and lower surfaces thereof.

In addition, a molded part 10 is formed on the substrate 15 having the light source 5 disposed thereon. The molded part 10 is made by curing resin, etc., and preferably made of a transparent Epoxy Molding Compound (EMC) layer containing phosphor to minimize color dispersion.

In the present invention, a mold (not shown) for forming the molded part 10 can have various shapes to obtain various forms of the molded part 10. For example, as shown in FIGS. 3(a) and (b), the molded part 10 can have an upper surface with a funnel-shaped center, or as shown in FIG. 3(c), can have an upper surface with a depressed center, and centrally depressed peripheral edges, and protruded edge corners. These shapes of the mold (not shown) for the molded part 10 can be formed by machining the mold in advance according to the desired structure of the molded part 10, as will be described later in a manufacturing method of the package.

After forming the molded part 10 in one of the above structures, a reflective layer 20 is formed on the molded part 10, covering the outer surface of the molded part 10. The reflective layer 20 is formed by depositing metal selected from a group consisting of Al, Au, Ag, Ni, W, Ti and Pt. Alternatively, the reflective layer 20 can be a thin film directly attached on an upper surface of the molded part 10 or a thin film encapsulating an upper surface of the molded part 10. The reflective layer 20 completely wraps an upper surface of the molded part 10 to prevent light from leaking upward therethrough, so that the side of the molded part 10 forms a light-transmitting surface 17.

The light-transmitting surface 17 is preferably formed substantially perpendicular to a plane of the substrate 15 on which the LED chip mounted the light source 5. In addition, as shown in FIGS. 3 and 4, the light-transmitting surface 17 may be a circumferential surface or an angled surface having a polygonal edge shape.

Preferably, the reflective layer 20, the molded part 10 and the substrate 15 have the same edge shape so that the reflective layer 20 completely covers the upper surface of the molded part 10 to prevent light from leaking upward therethrough.

In addition, the side-emitting LED package 1 according to the present invention may have a light source composed of one LED chip disposed inside the molded part 10 as shown in FIG. 5(a), or a plurality of LED chips disposed inside the molded part 10 as shown in FIG. 5(b).

Now, a manufacturing method of the side-emitting LED package according to the present invention will be explained in detail hereinafter.

Figure 6:
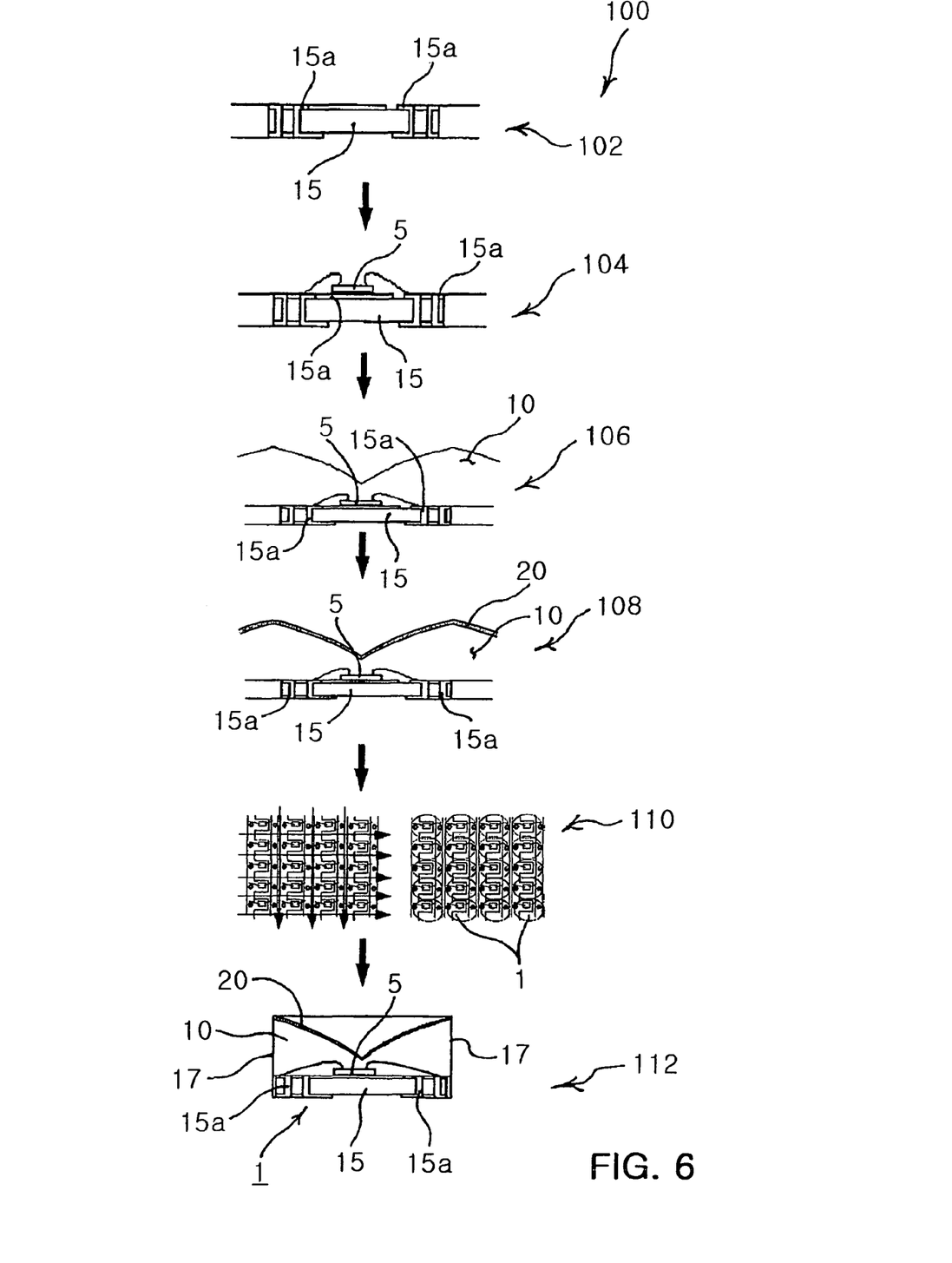
FIG. 6 is a view illustrating a manufacturing method of the side-emitting LED package having one LED chip as a light source.

As shown in FIG. 6, in the manufacturing method 100 of the side-emitting LED package of the present invention, one LED chip needs to be prepared to be disposed 5 inside one molded part 10 having a reflective layer 20 thereon, forming a light source.

The manufacturing method 100 of the side-emitting LED package according to the present invention starts with a step 102 of providing a substrate 15 with electrodes 15a formed thereon. The substrate 15 may be a PCB or a ceramic substrate with vertical electrodes such as a via and pattern electrodes 15a formed thereon, and in either case, vias are formed as a vertical electrode in areas where the LED chips are mounted as a light source 5.

The next step 104 is disposing a light source 5 on the substrate 15.

More specifically, in this step 104, a plurality of LED chips are mounted on one substrate 15 to form a plurality of light sources 5 for a plurality of unit packages, and each of the light sources 5 are electrically connected to each of the electrodes 15a of the substrate 15.

In the next step 106, a molded part 10 is formed on the substrate 15 having the above described light source 5 disposed thereon. In this step 106, the molded part 10 preferably contains phosphor and is formed by transparent Epoxy Molding Compound (EMC) transfer molding to minimize color dispersion after it is cured.

In addition, as described with reference to FIG. 3, the molded part 10 can be formed with a mold (not shown) which may be in various forms such as having an upper surface with a funnel-shaped center, or having an upper surface with a depressed center and centrally depressed peripheral edges.

In the next step 108, metal having high reflectivity, for example, selected from a group consisting of Al, Au, Ag, Ni, W, Ti and Pt is deposited on an outer surface of the molded part 10, or a separate thin film having a high reflectivity is attached on or encapsulates the molded part 10. With the molded part 10 formed as just described, in the next step 110, the substrate 15, the molded part 10, and the reflective layer 20 stacked in their order are cut.

The above cutting step 110 may adopt dicing, breaking, or laser cutting depending on the desired structure of the side-emitting LED package.

That is, for a side-emitting LED package 1 having a rectangular edge-shaped light transmitting surface 17, the substrate 15, the molded part 10, and the reflective layer 20 are diced or broken to be separated into individual side-emitting LED package 1 in the step 110.

Alternatively, the substrate 15, the molded part 10 and the reflective layer 20 may be laser-machined to obtain a side-emitting LED package 1 having circumferential-edge light-transmitting surfaces 17.

The substrate 15, the molded part 10 and the reflective layer 20 are cut as just described to obtain the side-emitting LED package 1 having one LED chip mounted therein for the light source 5 in step 112.

The side-emitting LED package manufactured as described has the reflective layer 20 completely covering an upper surface of the molded part 20, thereby preventing light, emitted from the LED chip which is the light source 5, from being scattered through the upper part thereof and effectively reflecting light sideward from the side of the package.

In addition, the substrate 15, the molded part 10 and the reflective layer 20 can be easily mass-produced by a process of manufacturing a PCB with increased productivity. Moreover, with the molded part 10 minimizing color dispersion, the side-emitting LED package 1 has superior emission capabilities.

Figure 7:
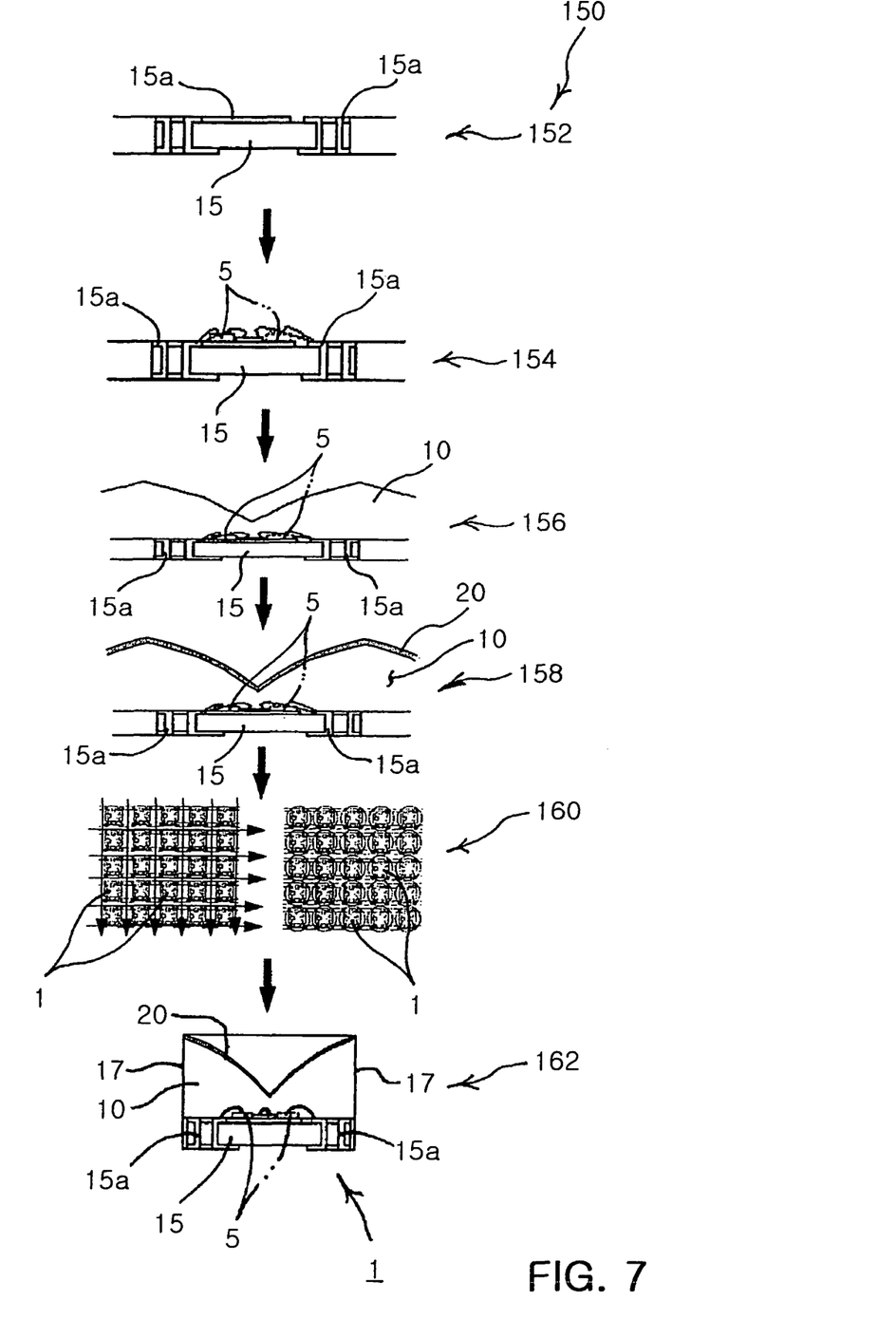
FIG. 7 is a view illustrating a manufacturing method of the side-emitting LED package having a plurality of LED chips as a light source.

FIG. 7 illustrates step-by-step another manufacturing method 150 of a side-emitting LED package according to the present invention, in which a plurality of LED chips are disposed as a light source inside one molded part 10 having a reflective layer 20 thereon.

The manufacturing method of the side-emitting LED package starts with a step 152 of providing a substrate 15 with electrodes 15a formed thereon as explained herein with reference to FIG. 6.

In an area on the substrate 15 where the LED chips for the light source 5 are mounted on, the electrodes 15a are formed and a plurality of vias are formed to function as vertical electrodes.

The next step 154 is disposing a plurality of LED chips on the substrate 15 for the light source, and electrically connecting each of the LED chips to each of the electrodes 15a using wires.

In the next step 156, a molded part 10 is formed on the substrate 15 with the light sources disposed thereon, in which the molded part 10 is formed by transparent Epoxy Molding Compound (EMC) transfer molding.

In the next step 158, as explained herein with reference to FIG. 6, metal having a high reflectivity, for example, selected from a group consisting of Al, Au, Ag, Ni, W, Ti and Pt is deposited on an outer surface of the molded part 10, or a thin film having a high reflectivity is attached on or encapsulates the molded part 10.

In the last step 160, the substrate 15, the molded art 10 and the reflective layer 20 are cut to form light-transmitting surfaces 17 on cut sections.

The substrate 15, the molded part 10 and the reflective layer 20 are cut as just described to obtain a plurality of side-emitting LED packages 1 having a plurality of LED chips for the light source 5 therein in the step 162.

The side-emitting LED package 1 manufactured as just described has the reflective layer 20 completely covering an upper part of the molded part 10, preventing light emitted from the light source 5 from being scattered upward of the reflective layer 20, thereby effectively reflecting light sideward through the light-transmitting surface 17.

In addition, the substrate 15, the molded part 10 and the reflective layer 20 can be mass-produced by a PCB manufacturing process, with increased productivity. Moreover, with the molded part 10 minimizing color dispersion and a plurality of LED chips used for the light source, the side-emitting LED package 1 has superior emission capabilities.

In addition, the present invention can obtain white light by mounting a red LED chip, a green LED chip and a blue LED chip for the light source 5.

Furthermore, a Zener diode can also be mounted in the package.

In the present invention as set forth above, a molded part can be formed without being restricted in shapes, thereby enabling a compact thin package. Further, a light-transmitting surface is formed substantially perpendicular to a plane where a LED chip is mounted on, and thus the package can be manufactured in a small thickness regardless of the size of the LED chip.

In addition, the substrate is processed in the same fashion as a PCB, that is, the manufacturing process from mounting an LED chip to forming a molded part and cutting the stacked structure afterwards is proceeded in the same fashion as a manufacturing process of a PCB, enabling mass production and an LED array inside the package.

Moreover, in the present invention, a mold (not shown) for forming a molded part can have various forms to realize various structures of the molded part, which thus allows obtaining a reflective layer on the molded part in a desired form.

Furthermore, according to the present invention, the molded part contains phosphor and is formed by transparent Epoxy Molding Compound (EMC) transfer molding, thereby minimizing color dispersion after it is cured, and thus significantly enhancing the optical properties of the package.

The present invention has been described with reference to a preferred embodiments but the invention may be embodied in many different forms and should not be construed as limited to the embodiments set forth herein, While the present invention has been shown and described in connection with the preferred embodiments, it will be apparent to those skilled in the art that modifications and variations can be made without departing from the spirit and scope of the invention as defined by the appended claims.

What is claimed is:

1. A method of manufacturing a light emitting diode (LED) package for emitting light sideward from a light source, the method comprising steps of:
   providing a substrate with an electrode formed thereon;
   disposing a light source on the substrate;
   forming a molded part on the substrate with the light source disposed thereon, the molded part having an upper surface with a center thereof depressed concavely, and centrally depressed peripheral edges and protruded edge corners;
   forming a reflection layer for covering an entire upper surface of the molded part; and
   cutting the substrate, the molded part, and the reflection layer stacked in their order so that a light transmitting surface is formed on a cut section in the side of the molded part with the reflection layer thereon,
   wherein light emitted from the light source is reflected from the reflection layer and radiated in the horizontal direction through the light transmitting surface, and wherein the step of forming a reflection layer comprises attaching a thin film having a high reflectivity on the molded part.

2. The method according to claim 1, wherein the molded part contains phosphor and is formed by transparent Epoxy Molding Compound (EMC) transfer molding.

3. The method according to claim 1, wherein the step of cutting comprises cutting the reflection layer and the substrate such that they have the same edge shape as the molded part.

4. The method according to claim 1, wherein the step of forming a light transmitting surface comprises cutting the substrate, the molded part and the reflection layer in a direction that intersects a plane where the LED chip is disposed on.

* * * * *